United States Patent [19]
Frankel et al.

[11] Patent Number: 5,192,618
[45] Date of Patent: Mar. 9, 1993

[54] CORROSION PROTECTION BY FEMN BY ION IMPLANTATION

[75] Inventors: Gerald S. Frankel, Ossining; Igor Y. Khandros; Peter B. Madakson, both of Peekskill, all of N.Y.

[73] Assignee: International Business Machines Corporation, Armonk, N.Y.

[21] Appl. No.: 692,349

[22] Filed: Apr. 26, 1991

[51] Int. Cl.⁵ ............ B32B 15/04; G11B 5/127; G11B 5/66; B05D 5/12
[52] U.S. Cl. .................. 428/457; 204/157.4; 204/157.44; 204/157.46; 204/157.47; 204/157.5; 360/110; 360/113; 427/130; 428/469; 428/611; 428/632; 428/681; 428/677; 428/694; 428/920; 428/928; 148/101; 148/222; 148/239
[58] Field of Search ............ 428/469, 900, 611, 632, 428/457, 681, 677, 928; 360/110, 113; 204/157.4, 157.44, 157.46, 157.47, 157.5, 192.31; 427/130

[56] References Cited

U.S. PATENT DOCUMENTS

| | | | |
|---|---|---|---|
| 4,103,315 | 7/1978 | Hempstead et al. | 428/900 X |
| 4,242,710 | 12/1980 | Hempstead et al. | 360/113 |
| 4,618,542 | 10/1986 | Morita et al. | 428/694 |
| 4,724,016 | 2/1988 | Anthony | 148/421 |
| 4,743,308 | 5/1988 | Sioshansi et al. | 148/4 |
| 4,755,897 | 7/1988 | Howard | 360/113 |
| 4,764,478 | 8/1988 | Hiruta | 437/29 |
| 4,772,976 | 9/1988 | Otomo et al. | 360/125 |
| 4,849,082 | 7/1989 | Baty et al. | 204/192.31 |

OTHER PUBLICATIONS

J. Appl. Phys., 55 (9): 3308-3314 (May 1, 1984) P. B. Madakson "Effect of Implantation Dose on the Hardness, Friction, and Wear of SB-implanted Al."
Mater. Sci. and Eng., 90: 205-212 (1987) P. Madakson "Effects of Tin Ion and Nitrogen Ion Implantation on the Oxidaton of Titanium."
Vacuum, vol. 39, Nos. 2-4: 263-266 (1989) L. Yi et al. "The Mechanical and Corrosion Behavior of iron Implanted with $N^+$."
Mater. Sci. and Eng., 90: 229-236 (1987) K. Terashima et al. "Surface Modification of Electrodeposited Chromium Films By Ion Implantation."
IEEE-Transactions on Magnetics, Mag-14, No. 5: 521-523 (Sep. 1978) R. D. Hempstead et al. "Unidirectional Anisotropy in Nickel-Ion Films By Exchange Coupling With Antiferromagnetic Films."

Primary Examiner—Paul J. Thibodeau
Assistant Examiner—Leszek Kiliman
Attorney, Agent, or Firm—Scully, Scott, Murphy & Presser

[57] ABSTRACT

The present invention relates to the improvement of corrosion wear resistance of iron-manganese (FeMn) film by ion implantation and subsequent annealing without substantially affecting the magnetic properties of the magnetic material. A highly corrosive and wear resistant FeMn film is disclosed comprised of a layer of FeMn and at least one protective layer selected from the group consisting of nitrides, carbides and oxides, with said protective layer being formed at the surface of the FeMn layer.

30 Claims, 3 Drawing Sheets

CORROSION PROTECTION BY FEMN BY ION IMPLANTATION

BACKGROUND

1. Technical Field

The present invention relates to the improvement of thin films of iron manganese (FeMn) with respect to both corrosion and wear resistance, and more particularly to the formation of one or more protective layers consisting of nitrides, carbides and oxides.

2. Prior Art

The largest use of magnetic thin films is in memory and storage technologies. Of the thousands of magnetic materials studied for potential device applications, only a relatively few of them have proved to be technologically important. Some of the magnetic materials that have been or which continue to be studied for memory or storage devices, switching elements for logic manipulation, thin-film recording heads, thermomagnetic writing, etc. include iron-nickel alloys, cobalt-nickel, cobalt-phosphorus, copper-nickel-iron, iron oxides, chromium oxide and various ferrites.

Thin films are usually directly deposited on a substrate. The techniques of deposition vary from high-temperature liquid-phase epitaxy such as that used in the fabrication of garnet films, through electroplating, to vapor deposition and sputtering. Applications include magnetic bubble technology, magnetoresist sensors, thin film heads, and recording media.

As described in U.S. Pat. No. 4,103,315, thin films of FeMn, with approximately a 50—50 composition, have been used as an exchange bias layer in a magneto resistive (MR) sensor to reduce the erratic and discontinuous changes in sensitivity and linearity that occur as the domain configuration changes, i.e., the so-called Barkhausen noise.

One of the problems with the use of FeMn is its susceptibility to wear and corrosion. The material is exposed to corrosive environments during the thin film fabrication processes as well as during the operation of the magnetic recording system. The structure of a MR sensor is such as to expose a cross-section of a multilayered thin film stack known as the air bearing surface (ABS). Of these layers, FeMn will predominantly be the most susceptible to corrosion. Coupled with an adverse area ratio, this results in severe galvanic attack of the FeMn layer when the ABS is exposed to a corrosive environment.

While corrosion during a lapping process that exposes the ABS is a concern, of particular interest is the attack that can take place during and after a Reactive Ion Etch (RIE) process that may be used to define rails on the slider ABS. Since the RIE takes place after lapping and provides a very corrosive environment, the exposed FeMn layer is very susceptible to attack. Furthermore, reliability of the device during lifetime exposure in the file environment is an issue. It is therefore of interest to find a means to increase the corrosion resistance and wear resistance of FeMn films.

U.S. Pat. Nos. 4,242,710, 4,618,542 and 4,755,897 describe means of deposition of magnetic alloys which amount to bulk alloying. Through the process of bulk alloying, the bulk properties of the material are not maintained.

A process quite different from bulk alloying is surface alloying or surface modification. Surface alloying allows one to only alter the surface properties of a material, i.e., the bulk properties of the material are maintained. Various surface properties of materials which are influenced by surface composition include among others, wear, corrosion, friction and hardness. Ion implantation is a proven method for surface alloying.

Ion implantation has the advantage of being a finishing process which does not change the appearance of the treated surface. It is a highly controlled process which is limited to the very near surface of the material being treated and thus leaving the bulk properties unaltered. The process of ion implantation generally involves the injection of atoms of a chosen element into a chosen solid material to selected concentrations and depths in order to form an alloy or other product that has a different composition from the original solid and that consequently exhibits different and occasionally highly preferable chemical and physical properties. For example, surface mechanical properties and corrosion resistance may be improved by selectively altering the surface composition of a specimen See Madakson, P. B., J. Appl. Phys., 55, 3308 (1984); and Madakson, P. B., J. Mat. Sci. and Eng., 90, 205 (1987). Such a process is very advantageous for the case of MR heads as corrosion resistance may be imparted with no loss of the bulk magnetic properties.

U.S. Pat. No. 4,772,976 involves the ion implantation of nitrogen ions into the top surface of a thin film as a means of controlling the magnetic properties The ion implantation of nitrogen ions alone into iron and chromium have been reported to increase wear and corrosion resistance (see Yi, L. et al., Vacuum, Vol. 39, pp 263-6 (1989) and Terashima, T. et al., Mater. Sci. and Eng., Vol. 90, pp 229-36 (1987)). Other uses of ion implantation include the implantation of nitrogen, tantalum and inert gas ions with respect to Co-Cr-Mo alloys (U.S. Pat. No. 4,743,308); dual ion implantation of boron, silicon or arsenic ions in silicon for device fabrication (U.S. Pat. No. 4,764,478); the implantation of hafnium and xenon ions to control the corrosion of zirconium alloys (U.S. Pat. No. 4,849,082); and implantation of combinations of nitrogen, carbon, arsenic and chromium ions for improving corrosion and wear resistance of zirconium and zirconium alloys.

SUMMARY OF THE INVENTION

The present invention relates to highly corrosion resistant and wear resistant FeMn films comprised of a layer of FeMn and at least one protective layer, selected from the group consisting of nitrides, carbides and oxides, formed at the surface of the FeMn layer by dual ion implantation.

The present invention further relates to the process of improving the corrosion resistance and wear resistance of an FeMn film by a surface treatment comprising the sequential dual ion implantation of two reactive elements followed by the subsequent annealing thereof to form at least one protective layer on the FeMn layer, the protective layer being selected from the group consisting of nitrides, carbides and oxides. Reactive elements which can be dually implanted to form the protective nitride, carbide and/or oxide layers include chromium and nitrogen, titanium and nitrogen, silicon and nitrogen, silicon and carbon, chromium and carbon, titanium and carbon, and aluminum and oxygen.

DETAILED DESCRIPTION OF THE INVENTION

In accordance with the present invention, the corrosion resistance and wear resistance of FeMn thin films may be drastically increased by implanting ions of reactive elements capable upon subsequent annealing to form a protective layer thereon, said protective layer being selected from the group consisting of nitrides, carbides and oxides.

The reactive elements to be dually implanted into the FeMn layer are chosen depending upon which primary protective layer is desired to be formed on the film. Examples of possible reactive elements and the resulting protective layer are: chromium and nitrogen to form a chromium nitride layer, titanium and nitrogen to form a titanium nitride layer, silicon and nitrogen to form a silicon nitride layer, silicon and carbon to form a silicon carbide layer, chromium and carbon to form a chromium carbide layer, titanium and carbon to form a titanium carbide layer and aluminum and oxygen to form an aluminum oxide layer. The chromium and nitrogen combination resulting in the formation of a chromium nitride layer as the primary protective layer is preferred.

It is possible that a secondary protective layer, in addition to the primary protective layer, may be formed during the annealing process. In this embodiment, the annealing step is carried out in air. The presence of oxygen results in the formation of an oxide layer in addition to the primary protective layer. For example, where chromium and nitrogen are implanted to form the primary chromium nitride protective layer, a secondary protective layer of chromium oxide may form on top of said primary layer as well. As will be discussed later, the Cr ions are closer to the surface than the N ions, and any excess Cr ions which do not react with the lower implanted N ions will react with oxygen to form the secondary oxide layer.

The secondary oxide layer discussed above can be avoided by performing the annealing step in a non-oxygen atmosphere, i.e., a reducing atmosphere such as forming gas. The presence of some oxygen is inevitable and in order to insure the non-formation of an oxide layer, an excess of N ions should be implanted in order that the chromium reacts with the nitrogen ions and not with any oxygen that might be present.

Figure 1:
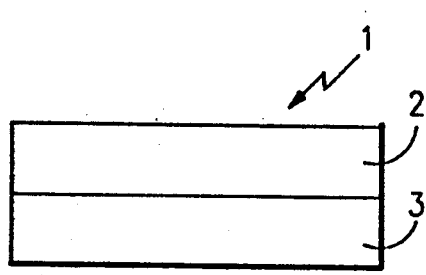
FIGS. 1-6 are schematic illustrations showing the steps of formation of the protective layer(s) on the FeMn films of the present invention.

As shown in FIG. 1, the process of forming the desired protective layer begins with a magnetic thin film 1 which consists of a layer of the thin film material 2, in the case of the present invention said layer 2 being an FeMn layer, deposited on a substrate 3.

Figure 2:
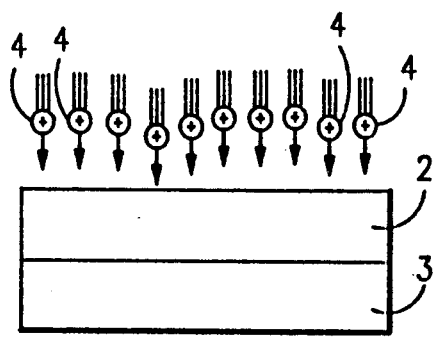

The initial step in the formation of the desired protective layer is the ion implantation of a first reactive element 4 as shown in FIG. 2. Element 4 is the reactive element which will penetrate the FeMn film surface the deepest. Element 4 is selected from the group consisting of nitrogen, carbon and oxygen. There exist numerous types of ion-implantation devices and it is not crucial to the practice of the invention which kind of ion implanter is utilized.

Figure 3:
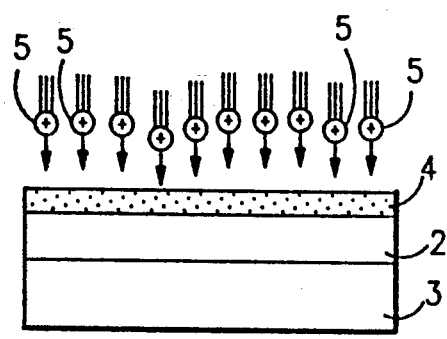

Following the implantation of the first reactive element 4 into the FeMn layer 2, a second reactive element 5 is similarly implanted into the FeMn layer 2 as shown in FIG. 3. Element 5 is the reactive element which will penetrate the FeMn film surface the least, i.e., will be the closest to the surface. Element 5 is selected from the group consisting of chromium, titanium, silicon and aluminum.

Figure 4:
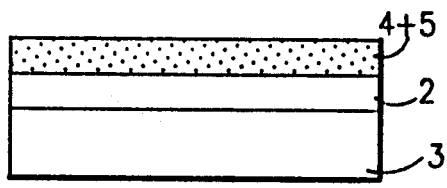
Figure 5:
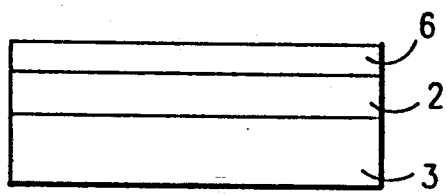
Figure 6:
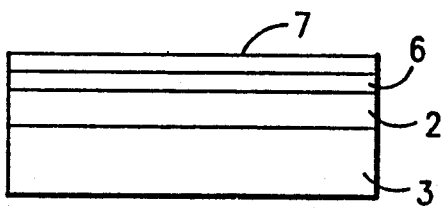

After both reactive elements 4 and 5 are implanted as shown in FIG. 4, the film 1 is subjected to an annealing process in which the two reactive elements 4 and 5 react to form the primary protective layer 6, as shown in FIG. 5. Layer 6 is thereby formed of either a nitride, carbide or oxide. As discussed, where the annealing step is effected in the presence of oxygen, an oxide layer 7 may form as well, as shown in FIG. 6. The oxide layer 7 will be an oxide of element 5. The annealing process also provides some relief to the earlier implantation step, i.e., the damage of the surface due to the ion implantation step is reduced.

Figure 8:
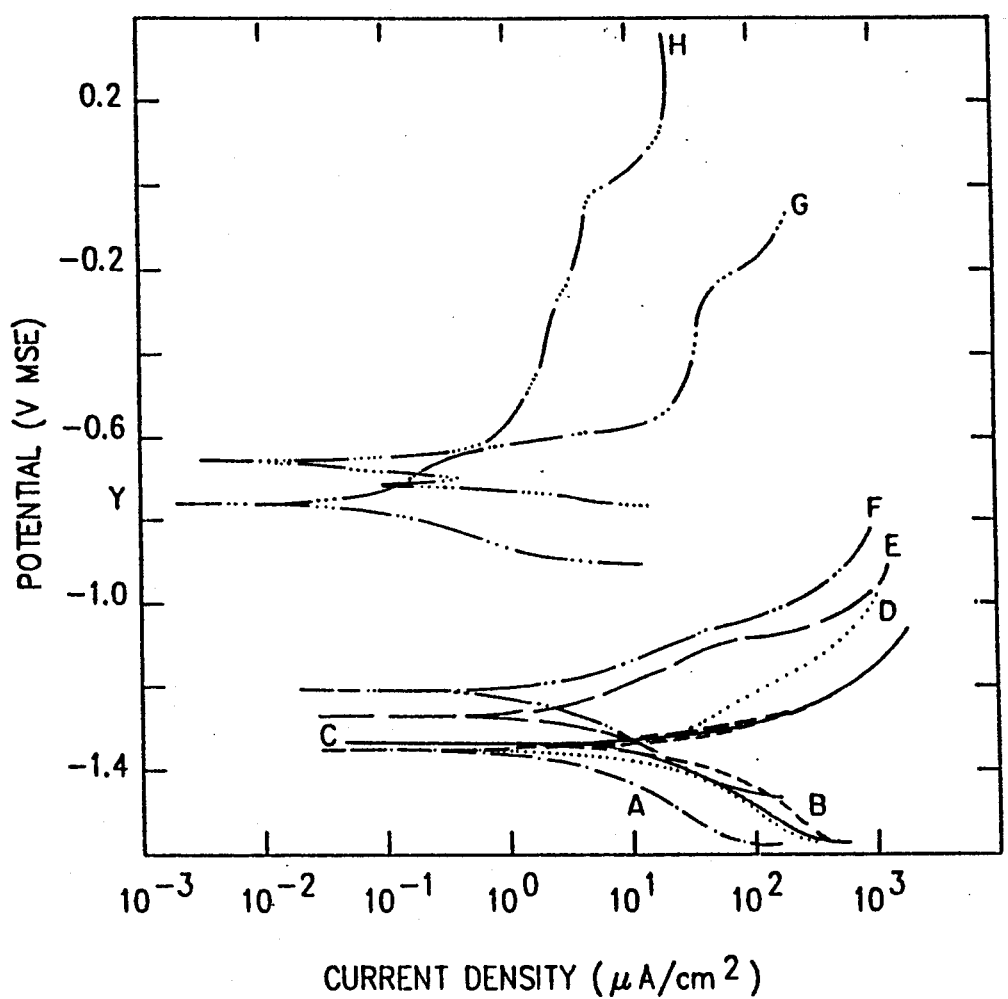
FIG. 8 shows the potentiodynamic polarization curves for various FeMn films with curves C and H representing improved FeMn films of the present invention in deaerated 0.1N $Na_2SO_4$.
Figure 7:
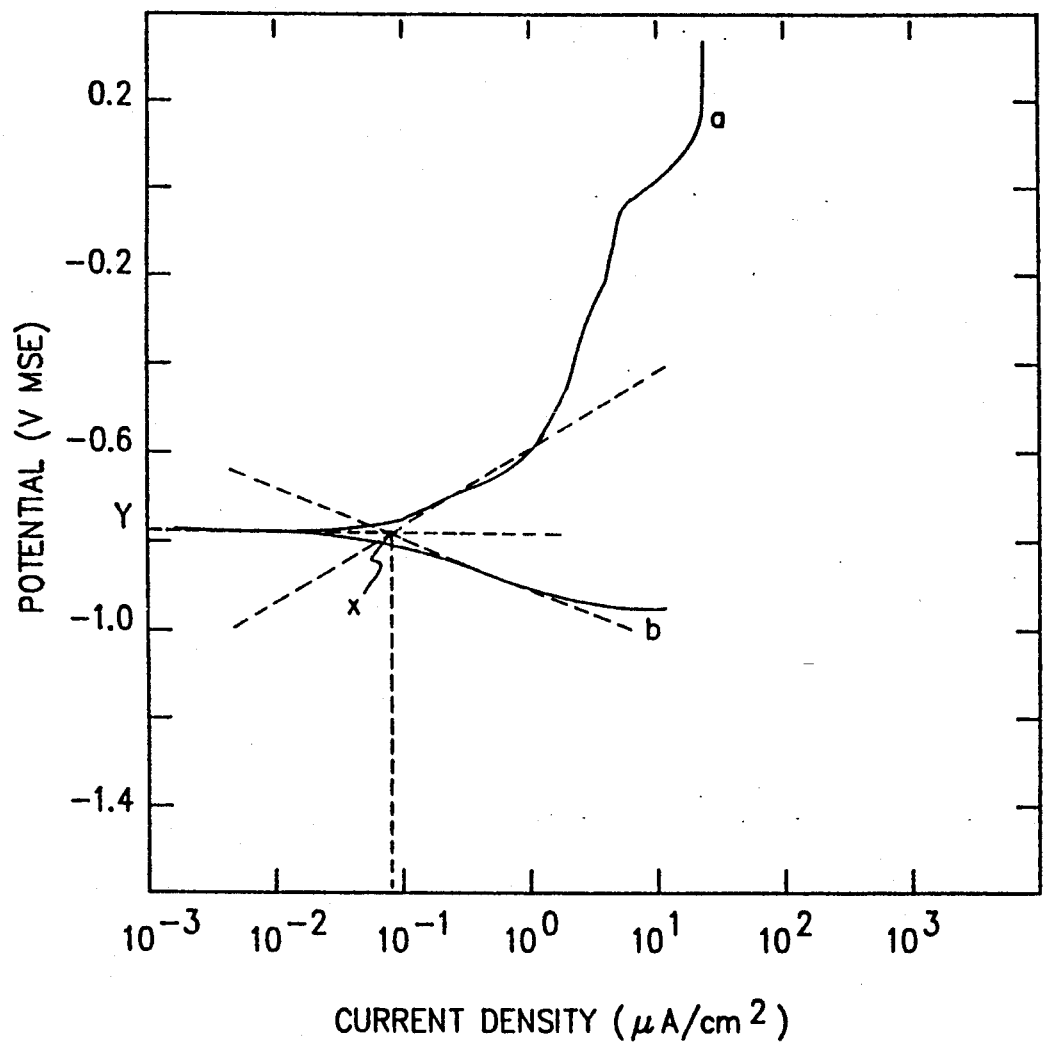
FIG. 7 shows the potentiodynamic polarization curve measured in $N_2$ saturated 0.1N $Na_2SO_4$ for an FeMn film of the present invention that has been implanted with $10^{16}$ Cr ions/cm$^2$ and $10^{17}$ N ions/cm$^2$.

Early in the study of corrosion, it was discovered that corrosion is an electrochemical process rather than a strictly chemical reaction In electrochemical corrosion testing two direct approaches can be taken: control the current (i.e., corrosion rate) and measure the resulting potential, or control the potential (i.e., oxidizing power) and measure the resulting current. In each case the potential of an electrode in a conducting media is changed by the flow of current in the electrolytic cell. This change in potential from a reversible or steady state value as a result of current is referred to as polarization. The schematic curves shown in FIGS. 7 and 8 are polarization curves. The term "potentiodynamic" simply refers to the fact that the polarization is carried out continuously rather than in steps.

FIGS. 7 and 8 show the potentiodynamic polarization curves for treated and untreated FeMn in $N_2$ saturated 0.1N $Na_2SO_4$. The FeMn film used in each curve was a 1100 Å thick film sputter deposited onto a glass substrate. FIG. 7 shows the potentiodynamic polarization curve of an FeMn film that had been implanted with Cr and N, the Cr at a fluence of $10^{16}$/cm$^2$ and the N at a fluence of $10^{17}$/cm$^2$, and both at a power of 50 keV. This relatively low power was chosen to limit the penetration depth of the implanted ions. FIG. 7 is used to illustrate how the corrosion potential of the sample is calculated as well as its corrosion rate.

In FIG. 8, the identical curve for the treated FeMn film shown in FIG. 7 is again shown (see Curve H), along with the following FeMn films:
Curve A—untreated FeMn film
Curve B—annealed only in air
Curve C—implanted with $10^{15}$ Cr ions/cm$^2$
Curve D—implanted with $10^{15}$ Cr ions/cm$^2$ and $10^{17}$ N ions/cm$^2$
Curve E—implanted with $10^{16}$ Cr ions/cm$^2$
Curve F—implanted with $10^{17}$ Cr ions/cm$^2$ Curve G—implanted with $10^{17}$ Cr ions/cm$^2$ and $10^{17}$ N ions/cm$^2$ Curve H—implanted with $10^{16}$ Cr ions/cm$^2$ and $10^{17}$ N ions/cm$^2$ All implanted samples, i.e., FeMn films, were subsequently annealed in air for 1 hour at 200° C. The potential is measured against a mercurous sulfate electrode (MSE).

Rutherford Backscattering Spectroscopy (RBS) trim calculations predict a penetration depth of 200-300 Å for the Cr ions and 500-600 Å for the N ions. Following implantation, the specimen was annealed in air at 200° C. for one hour. The annealing was carried out to form protective oxide and nitride layers and to allow some of the damage from the implantation to anneal out.

The theory behind the calculations which can be made with respect to these potentiodynamic polarization curves is well known and need not be repeated here. Reference for the theory behind these polarization curves is made to *Handbook On Corrosion Testing and Evaluation*, W. H. Ailor, Ed., John Wiley & Sons, Inc., New York, 1971.

For illustrative purposes regarding the subject invention, the corrosion potential of the sample is measured by the part of the curve which is to the farthest left of the diagram. Therefore, in FIG. 7, the corrosion potential (y) of the sample is approximately $-0.78$ v. Again, for simplicity, the corrosion rate (x) is measured by extrapolating both the anodic and cathodic regions to the curve (a and b, respectively) to the corrosion potential (see the dotted lines in FIG. 7). Therefore, in FIG. 7, the corrosion current density is approximately 0.08 $\mu A/cm^2$.

Looking now at FIG. 8, the benefits of the present invention can be clearly seen. Polarization curves G and H are those curves which follow the teaching of the present invention, i.e., represent the FeMn film which was subjected to the surface treatment in accordance with the process described above. Polarization curves A through F represent various other samples not in accordance with the present invention.

A cursory review of the polarization curves illustrated in FIG. 8 show that the corrosion potential of curves G and H is hundreds of mV higher than the corrosion potential of curves A through F. Of course, the higher the corrosion potential, the less susceptible is the sample to galvanic corrosion attack. With respect to the corrosion rate, it can be easily seen that the corrosion rate of curves G and H are much less than those of curves A through F. For example, the corrosion rate of curve G is about 40 times less than that of curve A (the untreated FeMn). Implantation with Cr alone provided a much smaller improvement in corrosion properties, not any where near the improvements demonstrated in curves G and H. It is to be emphasized that the differences shown by these potentiodynamic curves in terms of corrosion are equal to vast improvements.

Figure 9:
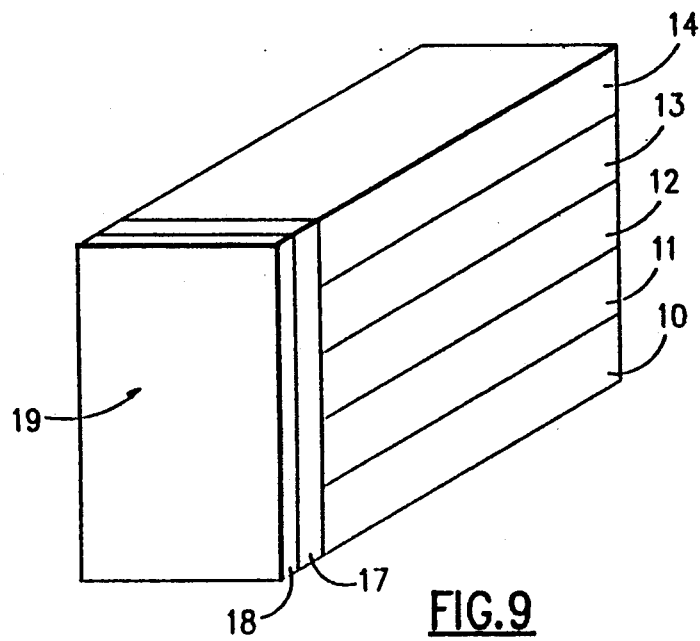
FIG. 9 is a perspective representation of a thin film MR sensor having an improved corrosive and wear resistant FeMn layer according to the present invention.

One possible use of the improved FeMn film of the present invention is in thin film magneto resistive sensors. FIG. 9 shows a multi-layered cross-sectional view of a typical thin film MR sensor which has been improved in accordance with the present invention. As shown, a MR sensor comprises a substrate 10, a transverse bias layer 11, a space layer 12, a MR layer 13 and an antiferromagnetic layer 14. The MR layer 13 is formed of ferromagnetic material, e.g., NiFe, and is attached to electrical conductors (not shown), thus providing an output current. The output current from MR layer 13 is a signal that enables a separate sensing circuit to determine changes in resistance in the MR layer. The resistance changes are a function of changes in the magnetic fields intercepted by MR layer 13 from recorded data on the magnetic storage medium 16.

An antiferromagnetic layer 14 of FeMn is formed on MR layer 13 to assure that MR layer 13 has uniaxial anisotropy. The antiferromagnetic layer 14 provides an interface exchange coupling with the ferromagnetic MR layer 13 resulting in a longitudinal exchange bias field in MR layer 13. This creates a single magnetic domain state in MR layer 13 which is essential to suppress Barkhausen noise which is associated with MR materials exhibiting multiple magnetic domain states.

The transverse bias layer 11 gives a magnetic field oriented generally perpendicular to the medium and maintains the MR layer 13 in a linear response mode. Consequently, the current output is essentially a linear function of the resistance changes.

The entire air bearing surface 19 of the thin film MR sensor is treated in accordance with the present invention so that a primary protective layer 17 and a secondary protective oxide layer 18 are formed covering the multi-layers referred to above, i.e. layers 10 through 14. Although the antiferromagnetic layer 14 receives the greatest benefit from protective layers 17 and 18 as it is the most susceptible to corrosion of layers 10-14, all the other layers benefit as well. The implantation can take place directly after the final ABS lap and before parting of the rows. Many devices can be implanted at once by stacking rows together which would reduce the cost.

While the invention has been particularly shown and described with respect to a preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A highly corrosion resistant and wear resistant FeMn film comprising a layer of FeMn and at least one protective layer formed at a surface of said FeMn layer by implanting ions of two reactive elements into the surface, said reactive elements being capable upon subsequent annealing to form, from the combination of said two reactive elements, said at least one protective layer, wherein one of said two reactive elements is selected from the group consisting of chromium, titanium, silicon and aluminum and the other reactive element is selected from the group consisting of nitrogen, carbon and oxygen.

2. The highly corrosion resistant and wear resistant FeMn film of claim 1 wherein said at least one protective layer is chromium nitride.

3. The highly corrosion resistant and wear resistant FeMn film of claim 1 wherein said at least one protective layer is titanium nitride.

4. The highly corrosion resistant and wear resistant FeMn film of claim 1 wherein said at least one protective layer is silicon nitride.

5. The highly corrosion resistant and wear resistant FeMn film of claim 1 wherein said at least one protective layer is silicon carbide.

6. The highly corrosion resistant and wear resistant FeMn film of claim 1 wherein said at least one protective layer is chromium carbide.

7. The highly corrosion resistant and wear resistant FeMn film of claim 1 wherein said at least one protective layer is titanium carbide.

8. The highly corrosion resistant and wear resistant FeMn film of claim 1 wherein said at least one protective layer is aluminum oxide.

9. The highly corrosion resistant and wear resistant FeMn film of claim 2 which further comprises a protective layer of chromium oxide.

10. The highly corrosion resistant and wear resistant FeMn film of claim 6 which further comprises a protective layer of chromium oxide.

11. The highly corrosion resistant and wear resistant FeMn film of claim 3 which further comprises a protective layer of titanium oxide.

12. The highly corrosion resistant and wear resistant FeMn film of claim 7 which further comprises a protective layer of titanium oxide.

13. The highly corrosion resistant and wear resistant FeMn film of claim 4 which further comprises a protective layer of silicon oxide.

14. The highly corrosion resistant and wear resistant FeMn film of claim 5 which further comprises a protective layer of silicon oxide.

15. A process for improving the corrosion resistance and wear resistance of an FeMn film by a surface treatment comprising:
   (a) sequentially implanting ions of two reactive elements in said FeMn film wherein one of said two reactive elements is selected from the group consisting of chromium, titanium, silicon and aluminum and the other reactive element is selected from the group consisting of nitrogen, carbon and oxygen; and
   (b) annealing said reactive elements to form, from the combination of said two reactive elements, at least one protective layer on the FeMn layer.

16. The process of claim 15 wherein the two reactive elements implanted into the FeMn layer are Cr and N.

17. The process of claim 15 wherein the two reactive elements implanted into the FeMn layer are Ti and N.

18. The process of claim 15 wherein the two reactive elements implanted into the FeMn layer are Si and N.

19. The process of claim 15 wherein the two reactive elements implanted into the FeMn layer are Si and C.

20. The process of claim 15 wherein the two reactive elements implanted into the FeMn layer are Cr and C.

21. The process of claim 15 wherein the two reactive elements implanted into the FeMn layer are Ti and C.

22. The process of claim 15 wherein the two reactive elements implanted into the FeMn layer are Al and O.

23. The process according to claim 15 wherein the reactive elements are annealed in air.

24. The process according to of claim 15 wherein the reactive elements are annealed in a non-oxygen atmosphere.

25. The process of claim 24 wherein the non-oxygen atmosphere is forming gas.

26. An improved magnetoresistive sensor of the type having an antiferromagnetic layer of FeMn, said sensor comprising:
   a layer of FeMn and at least one protective layer formed at a surface of said FeMn layer by implanting ions of two reactive elements into the surface, said reactive elements being capable upon subsequent annealing to form, from the combination of said two reactive elements, said at least one protective layer, wherein one of said two reactive elements is selected from the group consisting of chromium, titanium, silicon and aluminum and the other reactive element is selected from the groups consisting of nitrogen, carbon and oxygen.

27. The improved magnetoresistive sensor of claim 26 wherein said at least one protective layer formed on said FeMn layer is a nitride layer, said nitride layer being selected from the group consisting of chromium nitride, titanium nitride and silicon nitride 28. The improved magnetoresistive sensor of claim 26 wherein said at least one protective layer formed on said FeMn layer is a carbide layer, said carbide layer being selected from the group consisting of silicon carbide, chromium carbide and titanium carbide.

29. The improved magnetoresistive sensor of claim 26 wherein said at least one protective layer formed on said FeMn layer is aluminum oxide.

30. The improved magnetoresistive sensor of claim 26 which further comprises a protective oxide layer, said oxide layer being formed on said at least one protective layer formed on said FeMn layer.

* * * * *

UNITED STATES PATENT AND TRADEMARK OFFICE
CERTIFICATE OF CORRECTION

PATENT NO. : 5,192,618
DATED : March 9, 1993
INVENTOR(S) : Gerald S. Frankel, et al.

It is certified that error appears in the above-indentified patent and that said Letters Patent is hereby corrected as shown below:

On the Title Page, Section [54]: "BY FEMN" should read --OF FEMN--

Column 1, line 2: "BY FEMN" should read --OF FEMN--

Column 4, line 34: after "reaction" insert --.--

Column 8, line 32, Claim 27: after "nitride" insert --.--

Signed and Sealed this

Fourth Day of January, 1994

Attest:

BRUCE LEHMAN

Attesting Officer     Commissioner of Patents and Trademarks